US009504169B2

(12) United States Patent
Hwang et al.

(10) Patent No.: US 9,504,169 B2
(45) Date of Patent: Nov. 22, 2016

(54) PRINTED CIRCUIT BOARD HAVING EMBEDDED ELECTRONIC DEVICE AND METHOD OF MANUFACTURING THE SAME

(71) Applicant: SAMSUNG ELECTRO-MECHANICS CO., LTD., Suwon (KR)

(72) Inventors: Young Nam Hwang, Suwon (KR); Ju Wan Nam, Suwon (KR); Seung Wan Woo, Suwon (KR); Yee Na Shin, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 30 days.

(21) Appl. No.: 14/060,365

(22) Filed: Oct. 22, 2013

(65) Prior Publication Data
US 2015/0014034 A1    Jan. 15, 2015

(30) Foreign Application Priority Data

Jul. 15, 2013    (KR) .......................... 10-2013-0083156

(51) Int. Cl.
*H05K 1/18*    (2006.01)
*H05K 3/00*    (2006.01)
*H05K 3/46*    (2006.01)

(52) U.S. Cl.
CPC ............ *H05K 3/4697* (2013.01); *H05K 1/185* (2013.01); *H05K 3/0032* (2013.01); *H05K 3/4602* (2013.01); *H05K 3/4652* (2013.01); *H05K 2201/09827* (2013.01); *Y10T 29/4913* (2015.01); *Y10T 29/49146* (2015.01)

(58) Field of Classification Search
CPC .................... H05K 1/183; H05K 1/185; H05K 3/0032
See application file for complete search history.

(56) References Cited

U.S. PATENT DOCUMENTS

| | | | | |
|---|---|---|---|---|
| 3,290,558 | A * | 12/1966 | Sapy | 361/806 |
| 6,366,468 | B1 * | 4/2002 | Pan | 361/761 |
| 2004/0172814 | A1 * | 9/2004 | Shibata et al. | 29/831 |
| 2008/0054443 | A1 * | 3/2008 | Shih | 257/698 |
| 2012/0142147 | A1 | 6/2012 | Sakai | |
| 2013/0333930 | A1 * | 12/2013 | Koyanagi | 174/258 |

FOREIGN PATENT DOCUMENTS

JP    2004-193274    7/2004

* cited by examiner

*Primary Examiner* — Jeremy C Norris
(74) *Attorney, Agent, or Firm* — NSIP Law

(57) ABSTRACT

Disclosed herein are a printed circuit board having an embedded electronic device and a method of manufacturing the same. According to a preferred embodiment of the present invention, the printed circuit board having an embedded electronic device includes: a core substrate having circuit layers formed on both surfaces thereof; a taper-shaped cavity formed on the core substrate; and an electronic device embedded in the cavity.

13 Claims, 7 Drawing Sheets

FIG.15

| INTERVAL OF CAVITY(mm) | Θ1 | Θ2 |
|---|---|---|
| 0.05 | 69.0 | 71.6 |
| 0.06 | 65.3 | 68.2 |
| 0.07 | 61.7 | 65.0 |
| 0.08 | 58.4 | 61.9 |
| 0.09 | 55.3 | 59.1 |
| 0.10 | 52.4 | 56.3 |

PRINTED CIRCUIT BOARD HAVING EMBEDDED ELECTRONIC DEVICE AND METHOD OF MANUFACTURING THE SAME

CROSS REFERENCE TO RELATED APPLICATION

This application claims the benefit of Korean Patent Application No. 10-2013-0083156, filed on Jul. 15, 2013, entitled "Printed Circuit Board Having Embedded Electronic Device And Method Of Manufacturing The Same" which is hereby incorporated by reference in its entirety into this application.

BACKGROUND OF THE INVENTION

1. Technical Field

The present invention relates to a printed circuit board having an embedded electronic device and a method of manufacturing the same.

2. Description of the Related Art

Recently, as a demand for a small, high-performance mobile device, such as a smart phone, is rapidly increased, thinness and high integration have correspondingly also increased.

In particular, as a miniaturization method, in an application process (AP) of a mobile device, many products, which have active devices or passive devices embedded in a cavity in a substrate, have been produced.

A printed circuit board having and embedded electronic device is manufactured by a method of forming a cavity in an insulating layer, disposing the electronic device in the cavity, and fixing the electronic device into the insulating layer by using a filler, and the like. According to the above-mentioned embedding process, since the electronic device is mounted on a surface of the substrate and embedded in the substrate, the substrate may not only be miniaturized and highly integrated, but also implemented to have high performance.

However, since the printed circuit board having an embedded electronic device and the method of manufacturing the same according to the prior art require processes of forming the cavity in a core substrate, attaching a tape to one surface of the cavity, mounting a passive device therein, and filling a filler in the cavity to laminate an upper portion of the core substrate and laminate a lower portion thereof, the prior art has a problem in that a process is complicated and an operation time is long.

(Patent Document) JP Patent Laid-Open Publication No. 2004-193274
(Patent Document) US Patent Laid-Open Publication No. 2012-0142147

SUMMARY OF THE INVENTION

The present invention has been made in an effort to provide a printed circuit board having an embedded electronic device capable of reducing costs and simplifying a manufacturing process by supporting the electronic device on the entire surface of a cavity so as to remove a necessity of the use of a tape, by manufacturing the cavity having the electronic device embedded therein so as to match a size of the electronic device, and a method of manufacturing the same.

Further, the present invention has been made in an effort to provide a new cavity structure capable of reducing factors of a defect due to sequential lamination which is essential to embed an electronic device and the number of processes.

In addition, the present invention has been made in an effort to provide a printed circuit board having an embedded electronic device capable of reducing factors of an interlayer delamination defect, which is due to a problem of a sequential lamination of the prior art, by instead performing a collective lamination and improving performance, and a method of manufacturing the same.

According to a preferred embodiment of the present invention, there is provided a printed circuit board having an embedded electronic device, including: a core substrate having circuit layers formed on both surfaces thereof; a taper-shaped cavity formed on the core substrate; and an electronic device embedded in the cavity.

A width of the cavity of an upper surface of the core substrate may be formed to be larger than that of an upper portion of the electronic device.

A width of the cavity of a lower surface of the core substrate may be formed to be smaller than that of a lower portion of the electronic device.

The electronic device may be embedded to be spaced apart from both surfaces of the core substrate, respectively.

The width of the cavity may be formed so that both corners of the lower portion of the electronic device contact a tapered surface of the cavity to extend thereover.

The taper shape may include a hourglass shape.

The printed circuit board having an embedded electronic device may further include: an insulating layer laminated on both surfaces of the core substrate having the embedded electronic device.

The printed circuit board having an embedded electronic device may further include: an outer circuit layer formed on the insulating layer.

According to another preferred embodiment of the present invention, there is provided a method of manufacturing a printed circuit board having an embedded electronic device, including: preparing a core substrate having circuit layers formed on both surfaces thereof; forming a taper-shaped cavity on the core substrate; and embedding an electronic device in the cavity.

In the forming of the cavity, a width of an upper surface of the core substrate may be formed to be larger than that of an upper portion of the electronic device.

In the forming of the cavity, a width of a lower surface of the core substrate may be formed to be smaller than that of a lower portion of the electronic device.

In the embedding of the electronic device, the electronic device may be spaced apart from both surfaces of the core substrate.

In the embedding of the electronic device, both corners of a lower portion of the electronic device may contact a tapered surface to extend thereover.

The taper shape may include a hourglass shape.

The forming of the cavity may be performed by $CO_2$ laser machining.

The method of manufacturing a printed circuit board having an embedded electronic device may further include: laminating insulating layers on both surfaces of the upper and lower portions of the core substrate having the embedded electronic device.

The method of manufacturing a printed circuit board having an embedded electronic device may further include: forming an outer circuit layer on the insulating layer.

BRIEF DESCRIPTION OF THE DRAWINGS

The above and other objects, features and advantages of the present invention will be more clearly understood from the following detailed description taken in conjunction with the accompanying drawings, in which:

FIG. 15 is a diagram for schematically describing the angle at which the electronic device according to the preferred embodiment of the present invention is put on the tapered surface.

DESCRIPTION OF THE PREFERRED EMBODIMENTS

Figure 1:
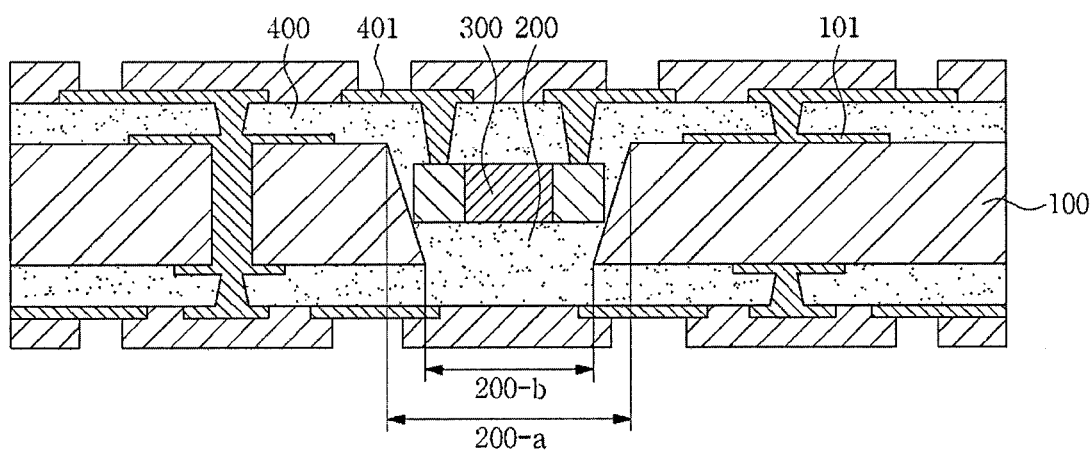
FIG. 1 is a cross-sectional view schematically illustrating a collectively laminated structure of a printed circuit board having an embedded electronic device according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, an electric blower according to preferred embodiments of the present invention will be described in detail with reference to the accompanying drawings.

Printed Circuit Board Having Embedded Electronic Device

First Preferred Embodiment

FIG. 1 is a cross-sectional view illustrating a collectively laminated four-layer structure of a printed circuit board having an embedded electronic device according to a preferred embodiment of the present invention.

Referring to FIG. 1, the printed circuit board having an embedded electronic device according to the preferred embodiment of the present invention includes a core substrate 100 having circuit layers 101 formed on both surfaces thereof, a taper-shaped cavity 200 formed on the core substrate 100, and an electronic device 300 embedded in the cavity 200.

As a method of forming the circuit layers 101 on the core substrate 100, various methods, such as a subtractive method of selectively removing a portion of upper and lower metal layers of the core substrate 100 on which the metal layers are laminated, an additive method of additionally forming wiring patterns on an insulating substrate using an electroless plating method and an electroplating, and a method of forming conductive ink on an insulating layer by an inkjet method, may be selected as needed. The metal layer is made of a conductive metal having a thin plate form. For example, there may be a copper foil (Cu foil), and the like.

Herein, the electronic device 300 is a part which is electrically connected to the printed circuit board to be able to perform a predetermined function and is referred to as an electronic device 300 which may be embedded in the printed circuit board, such as an integrated circuit chip (IC) and MLCC, without being limited to any one part.

Herein, a width 200-$a$ of the cavity of an upper surface of the core substrate 100 is formed to be larger than that of an upper portion of the electronic device 300 and a width 200-$b$ of the cavity of a lower surface of the core substrate 100 is formed to be smaller than that of a lower portion of the electronic device 300.

In this case, the electronic device 300 is embedded, being spaced apart from both surfaces of the core substrate 100, respectively, and the width of the cavity 200 is formed so that both corners of the lower portion of the electronic device 300 contact the tapered surface of the cavity 200 to extend thereover.

The printed circuit board further includes insulating layers 400 laminated on both surfaces of the core substrate 100 in which the electronic device 300 is embedded and further includes an outer circuit layer 401 formed on the insulating layer 400.

Herein, the electronic device 300 may be electrically connected the circuit layer 101 and/or the outer circuit layer 401 by forming the insulating layers 400 on upper and lower surfaces of the core substrate 100, forming the outer circuit layer 401 thereon, and then machining a via hole, and the like, in the insulating layer 400.

In addition, as the insulating layer 400, a resin insulating layer may be used. As a material of the resin insulating layer, a thermo-setting resin such as an epoxy resin, a thermo-plastic resin such as a polyimide resin, a resin having a reinforcement material such as a glass fiber or an inorganic filler impregnated in the thermo-setting resin and the thermo-plastic resin, for example, a prepreg may be used. In addition, a thermo-setting resin and/or a photo-curable resin, and the like, may be used. However, the material of the resin insulating layer is not particularly limited thereto.

In the circuit board field, if the conductive metals for a circuit may be used for the circuit layer 101 and/or the outer circuit layer 401, any conductive metal may be used without being limited and in the printed circuit board, copper may typically be used.

As such, the width of the cavity 200 of the upper surface of the core substrate 100 is formed to be larger than that of the upper portion of the electronic device 300 and the width of the cavity 200 of the lower surface of the core substrate 100 is formed to be smaller than that of the lower portion of the electronic device 300, such that the electronic device 300 is fixed over the tapered surface.

A bonding process used during a process of fixing the electronic device 300 in the cavity 200 according to the prior art may be omitted, thereby reducing the number of processes and manufacturing costs.

Further, factors of an interlayer delamination defect of a sequential lamination build-up method according to the prior art and the number of processes are reduced by collective lamination, thereby reducing time and costs.

In this case, one example allowing the electronic device 300 to easily extend over the tapered surface will be described with reference to FIGS. 13 to 15.

Figure 13:
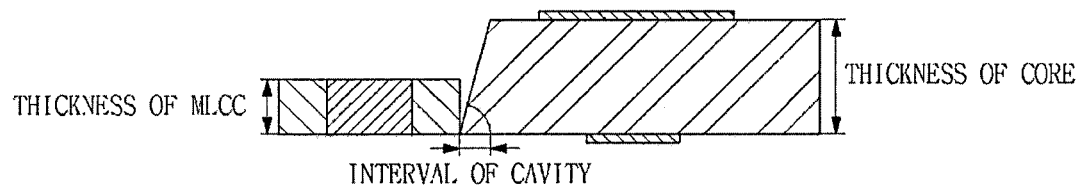
FIG. 13 is a cross-sectional view for schematically describing an angle allowing the electronic device according to the preferred embodiment of the present invention to extend over a tapered surface.
Figure 14:
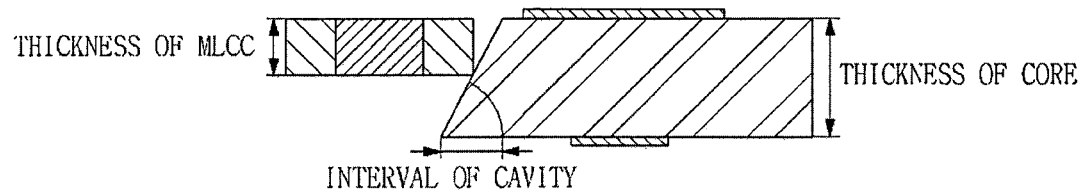
FIG. 14 is a cross-sectional view for schematically describing an angle allowing the electronic device according to another preferred embodiment of the present invention to extend over a tapered surface.

FIG. 13 is a cross-sectional view for schematically describing an interval and an angle of the cavity 200 allowing the electronic device 300 according to the preferred embodiment of the present invention to extend over a tapered surface of the cavity 200 and FIG. 14 is a cross-sectional view for schematically describing an interval and an angle of the cavity 200 allowing the electronic device 300 according to another preferred embodiment of the present invention to extend over a tapered surface of the cavity 200.

Referring to FIGS. 13 and 14, it is assumed that a thickness of the core substrate 100 is 0.15 mm and when the electronic device 300 is, for example, MLCC, a thickness of the MLCC is 0.13 mm.

When the thicknesses are set to be numerical values as illustrated in FIGS. 13 and 14, the interval of the cavity 200 and the angle of the lower surface of the core substrate may be appropriately defined with reference to a diagram of FIG. 15.

FIG. 15 is a diagram for schematically describing the interval and the angle of the cavity 200 allowing the electronic device 300 to extend over the tapered surface of the cavity 200.

For example, when the interval of the cavity 200 is 0.05 to 0.1 mm, the angle of the lower surface of the core substrate 100 may be appropriately set to be $52.4°<\theta<71.6°$, but according to the preferred embodiment of the present invention, the interval and angle value of the cavity 200 are not limited thereto.

In this case, when the angle is equal to or more than a value shown in the diagram, the electronic device 300 easily protrudes to the outside and when the angle is equal to or less than a value shown in the diagram, the electronic device 300 may not extend over the surface of the cavity 200.

Second Preferred Embodiment

Figure 2:
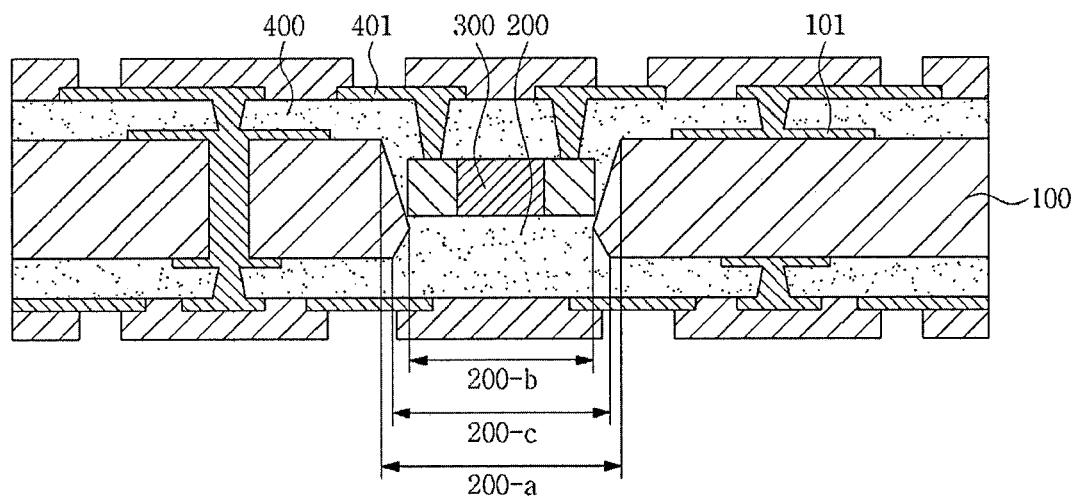
FIG. 2 is a cross-sectional view schematically illustrating a collectively laminated structure of a printed circuit board having an embedded electronic device according to another preferred embodiment of the present invention.

FIG. 2 is a cross-sectional view illustrating a collectively laminated four-layer structure of a printed circuit board having an embedded electronic device according to another preferred embodiment of the present invention.

Referring to FIG. 2, the printed circuit board having an embedded electronic device according to the preferred embodiment of the present invention includes a core substrate 100 having circuit layers 101 formed on both surfaces thereof, a taper-shaped cavity 200 formed on the core substrate 100, and an electronic device 300 embedded in the cavity 200.

Further, the taper shape includes a hourglass shape.

As a method of forming the circuit layers 101 on the core substrate 100, various methods, such as a subtractive method of selectively removing a portion of upper and lower metal layers of the core substrate 100 on which the metal layers are stacked, an additive method of additionally forming wiring patterns on an insulating substrate using an electroless plating method and an electroplating, and a method of forming conductive ink on an insulating layer by an inkjet method, may be selected as needed. The metal layer is made of a conductive metal having a thin plate form. For example, there may be a copper foil (Cu foil), and the like.

Herein, the electronic device 300 is a part which is electrically connected to the printed circuit board to be able to perform a predetermined function and is referred to as an electronic device which may be embedded in the printed circuit board, such as an integrated circuit chip (IC) and MLCC, without being limited to any one part.

Herein, a width 200-a of the cavity of an upper surface of the core substrate 100 is formed to be larger than that of an upper portion of the electronic device 300 and a width 200-b of the cavity of a lower surface of the core substrate 100 is formed to be smaller than that of a lower portion of the electronic device 300.

Further, a width 200-c of the cavity of a bottom surface of the core substrate 100 may be formed to be larger than that of the lower portion of the electronic device 300.

In this case, the electronic device 300 is embedded, being spaced apart from both surfaces of the core substrate 100, respectively, and the width of the cavity 200 is formed so that both corners of the lower portion of the electronic device 300 contact the tapered surface of the cavity 200 to extend over the tapered surface thereof.

The printed circuit board further includes insulating layers 400 stacked on both surfaces of the core substrate 100 in which the electronic device 300 is embedded and further includes an outer circuit layer 401 formed on the insulating layer 400.

Herein, the electronic device 300 may be electrically connected the circuit layer 101 and/or the outer circuit layer 401 by forming the insulating layers on upper and lower surfaces of the core substrate 100, forming the outer circuit layer 401 thereon, and then machining a via hole, and the like, in the insulating layer 400.

As the insulating layer 400, a resin insulating layer may be used. As a material of the resin insulating layer, a thermo-setting resin such as an epoxy resin, a thermo-plastic resin such as a polyimide resin, a resin having a reinforcement material such as a glass fiber or an inorganic filler impregnated in the thermo-setting resin and the thermo-plastic resin, for example, a prepreg may be used. In addition, a thermo-setting resin and/or a photo-curable resin, and the like, may be used. However, the material of the resin insulating layer is not particularly limited thereto.

In the circuit board field, if the conductive metals for a circuit may be used for the circuit layer 101 and/or the outer circuit layer 401, any conductive metal may be used without being limited and in the printed circuit board, copper may typically be used.

As such, the electronic device is fixed in the hourglass-shaped cavity 200 of the core substrate 100, such that the bonding process used in the process of fixing the electronic device 300 in the cavity 200 according to the prior art may be omitted.

According to the structure of the present invention, the number of process and the manufacturing costs may be reduced.

Further, factors of an interlayer delamination defect of a sequential lamination build-up method according to the prior art and the number of processes are reduced by collective lamination, thereby reducing time and costs.

Method of Manufacturing Printed Circuit Board Having Embedded Electronic Device

First Preferred Embodiment

FIGS. 3 to 6 are process flow charts schematically illustrating a method of manufacturing a printed circuit board having an embedded electronic device according to still another preferred embodiment of the present invention.

Figure 3:
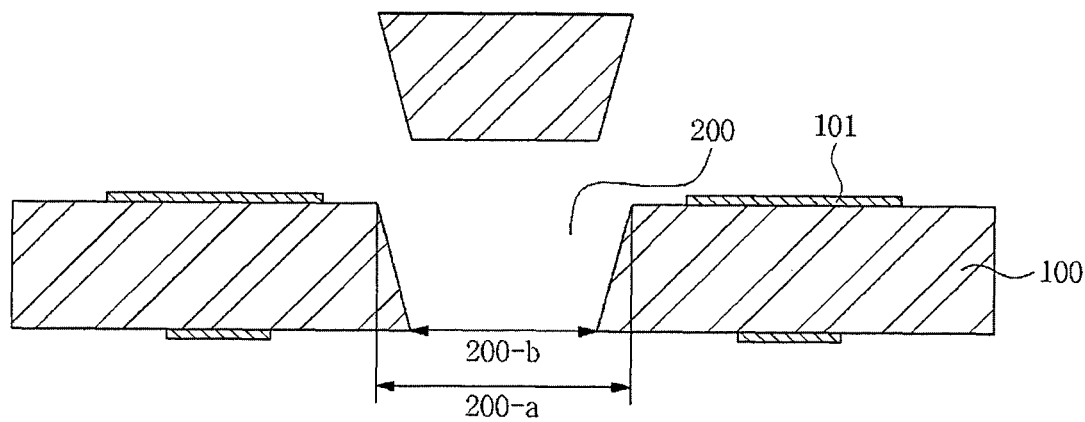
FIGS. 3 to 6 are process flow charts schematically illustrating a method of manufacturing a printed circuit board having an embedded electronic device according to still another preferred embodiment of the present invention.

Referring to FIG. 3, the core substrate 100 having the circuit layers 101 formed on both surfaces thereof is prepared and then the taper-shaped cavity 200 is formed on the core substrate 100.

In this case, in the forming of the cavity 200, the width 200-a of the cavity of the upper surface of the core substrate 100 is formed to be larger than that of the upper portion of the electronic device 300.

Further, the forming of the cavity 200 is performed so that the width 200-b of the cavity of the lower surface of the core substrate 100 is formed smaller than that of the lower portion of the electronic device 300.

Herein, the forming of the cavity 200 may be performed by $CO_2$ laser machining, but the preferred embodiment of the present invention is not particularly limited to laser.

Figure 12:
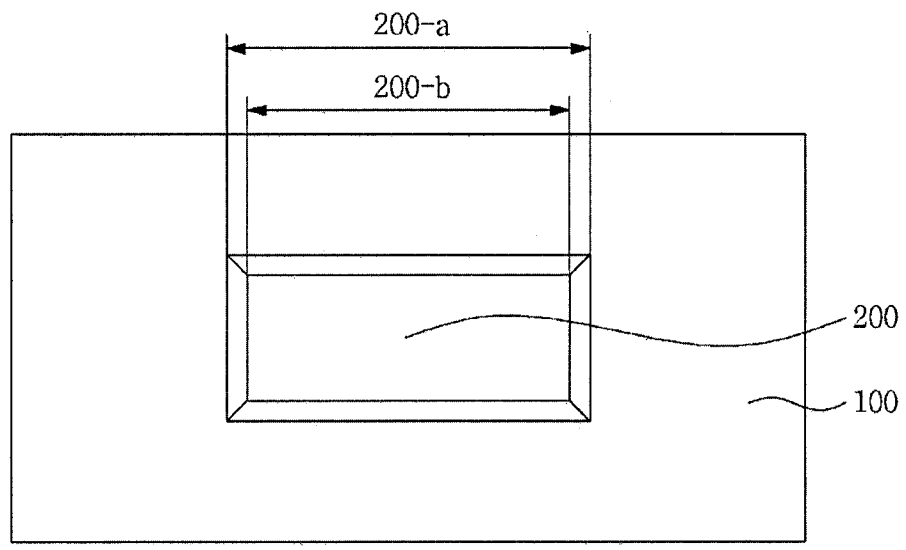
FIG. 12 is a plan view schematically illustrating a structure of the printed circuit board having an embedded electronic device according to the preferred embodiment of the present invention.

Herein, FIG. 12 is a plan view of the printed circuit board having an embedded electronic device according to the preferred embodiment of the present invention and is a diagram before the electronic device 300 is mounted and after the cavity 200 of the core substrate 100 is formed.

It may confirm the taper structure in which the width 200-a of the cavity of the upper surface is formed to be larger than the width 200-b of the cavity of the lower surface.

Further, FIG. 13 is a cross-sectional view for schematically describing an interval and an angle of the cavity 200 allowing the electronic device 300 according to the preferred embodiment of the present invention to extend over a tapered surface of the cavity 200 and FIG. 14 is a cross-sectional view for schematically describing an interval and an angle of the cavity 200 allowing the electronic device 300 according to another preferred embodiment of the present invention to extend over a tapered surface of the cavity 200.

Referring to FIGS. 13 and 14, it is assumed that a thickness of the core substrate 100 is 0.15 mm and when the electronic device 300 is, for example, MLCC, a thickness of the MLCC is 0.13 mm.

When the thicknesses are set to be numerical values as illustrated in FIGS. 13 and 14, the interval of the cavity 200 and the angle of the lower surface of the core substrate 100 may be appropriately defined with reference to a diagram of FIG. 15.

FIG. 15 is a diagram for schematically describing the interval and the angle of the cavity 200 allowing the electronic device 300 to extend over the tapered surface of the cavity 200.

For example, when the interval of the cavity 200 is 0.05 to 0.1 mm, the angle of the lower surface of the core substrate 100 may be appropriately set to be $52.4° < \theta < 71.6°$, but according to the preferred embodiment of the present invention, the interval and angle value of the cavity 200 are not limited thereto.

In this case, when the angle is equal to or more than a value shown in the diagram, the electronic device 300 easily protrudes to the outside and when the angle is equal to or less than a value shown in the diagram, the electronic device 300 may not extend over the surface of the cavity 200.

Figure 4:
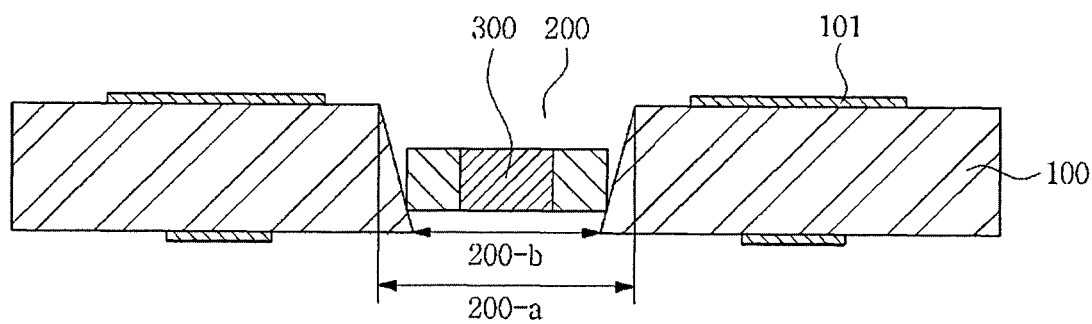

Referring to FIG. 4, the electronic device 300 is embedded in the formed cavity 200.

In this case, in the embedding of the electronic device 300, the electronic device 300 is spaced apart from both surfaces of the core substrate 100.

Further, both corners of the lower portion of the electronic device 300 contact the tapered surface to extend thereover.

Figure 5:
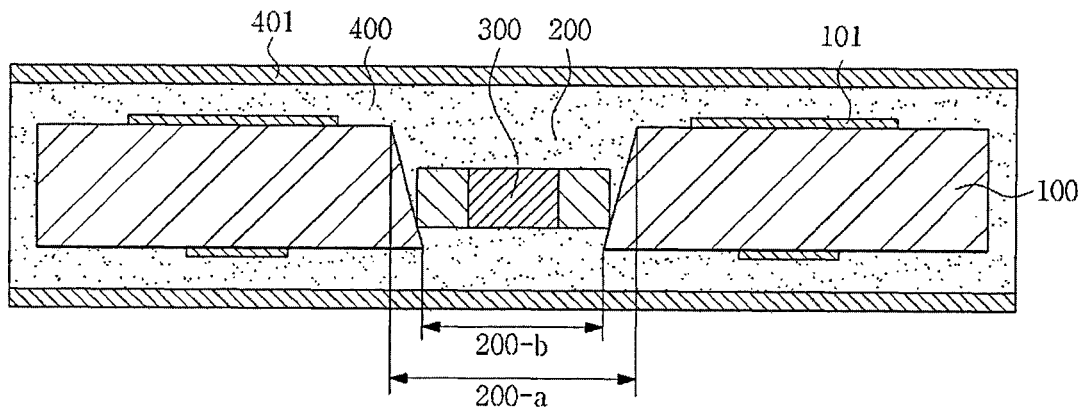

Referring to FIG. 5, the method of manufacturing a printed circuit board having an embedded electronic device further includes laminating the insulating layers 400 on both surfaces of the upper and lower portions of the core substrate 100 having the embedded electronic device 300.

Further, the method of manufacturing a printed circuit board having an embedded electronic device further includes forming the outer circuit layer 401 on the insulating layer 400.

Figure 6:
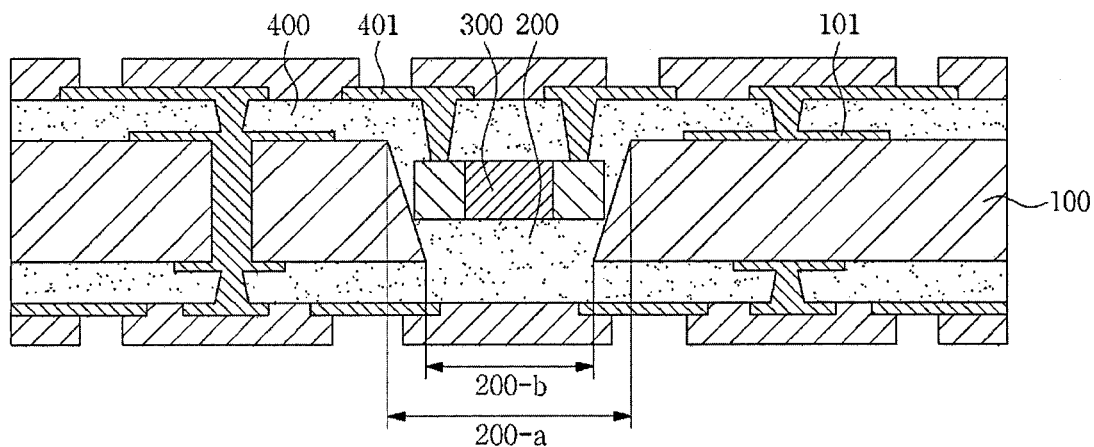

Referring to FIG. 6, the insulating layer 400 and the outer circuit layer 401 are collectively laminated on both surfaces of the core substrate having the embedded electronic device 300 and then the via hole, and the like, is machined in the insulating layer 400, such that the electronic device 300 may be electrically connected to the circuit layer 101 and/or the outer circuit layer 401.

Second Preferred Embodiment

FIGS. 7 to 11 are process flow charts schematically illustrating a method of manufacturing a printed circuit board having an embedded electronic device according to yet another preferred embodiment of the present invention.

Figure 7:
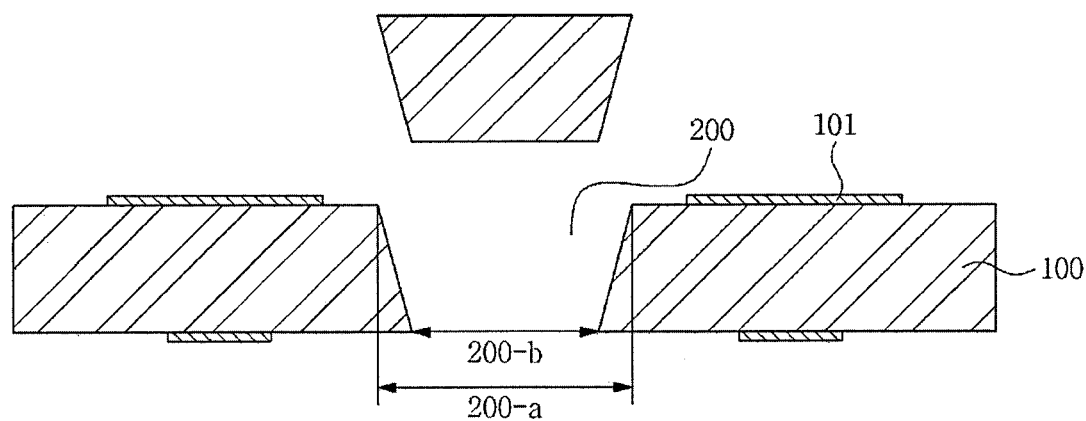
FIGS. 7 to 11 are process flow charts schematically illustrating a method of manufacturing a printed circuit board having an embedded electronic device according to yet another preferred embodiment of the present invention.

Referring to FIG. 7, the core substrate 100 having the circuit layers 101 formed on both surfaces thereof is prepared and then the taper-shaped cavity 200 is formed on the core substrate 100.

Figure 8:
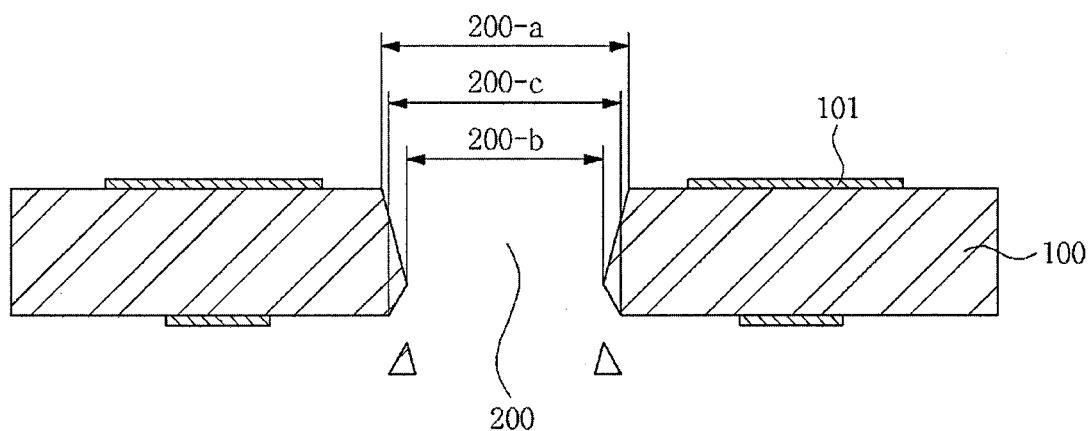

Referring to FIG. 8, the hourglass shape included in the taper shape is formed.

Herein, the width 200-a of the cavity of the upper surface of the core substrate 100 is formed to be larger than that of the upper portion of the electronic device 300.

The width 200-b of the cavity of the lower portion of the core substrate 100 is formed to be smaller than that of the lower portion of the electronic device 300.

Further, a width 200-c of the cavity of a bottom surface of the core substrate 100 may be formed to be larger than that of the lower portion of the electronic device 300.

Herein, the forming of the cavity 200 may be performed by the $CO_2$ laser machining, but the preferred embodiment of the present invention is not particularly limited to laser.

Figure 9:
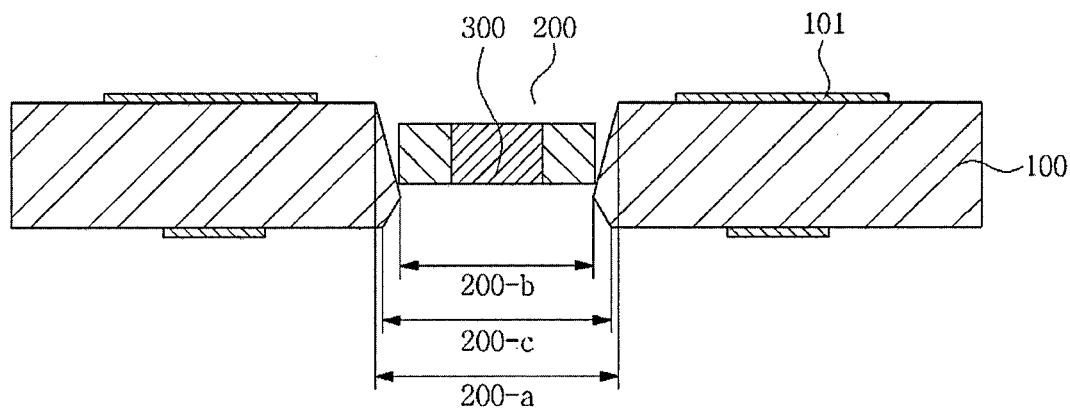

Referring to FIG. 9, the electronic device 300 is embedded in the cavity 200.

In this case, in the embedding of the electronic device 300, the electronic device 300 is spaced apart from both surfaces of the core substrate 100.

Further, both corners of the lower portion of the electronic device 300 contact the tapered surface to extend thereover.

Figure 10:
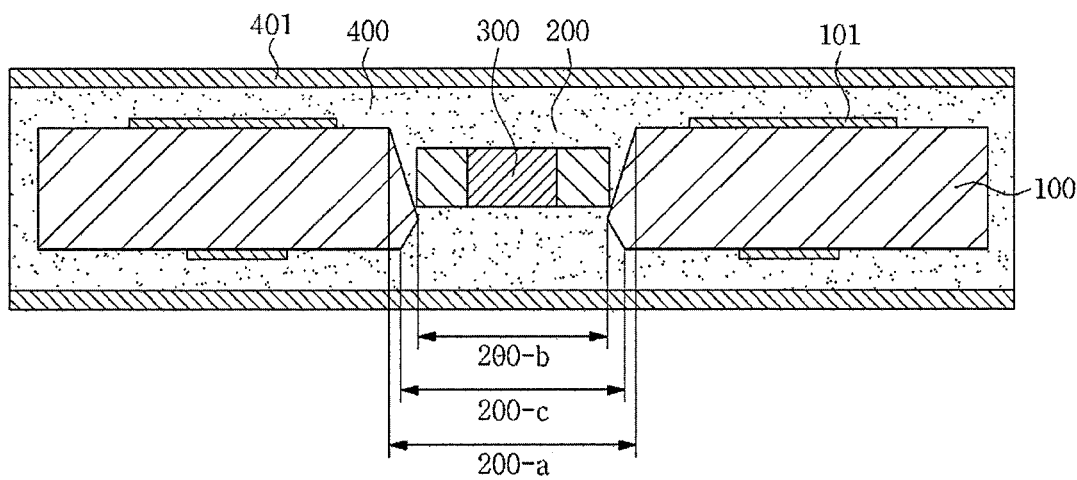

Referring to FIG. 10, the method of manufacturing a printed circuit board having an embedded electronic device further includes laminating the insulating layers 400 on both surfaces of the upper and lower portions of the core substrate 100 having the embedded electronic device 300.

Further, the method of manufacturing a printed circuit board having an embedded electronic device further includes forming the outer circuit layer 401 on the insulating layer 400.

Figure 11:
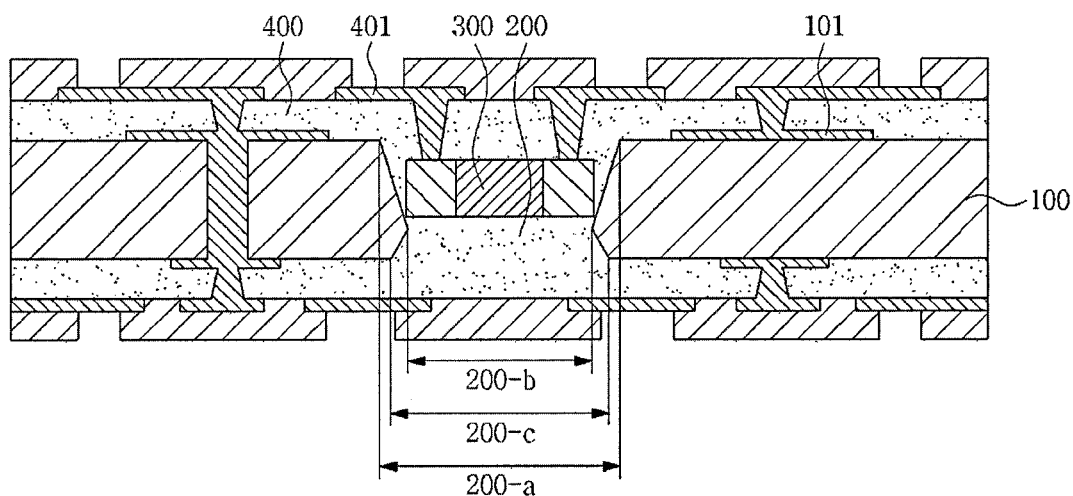

Referring to FIG. 11, the insulating layer 400 and the outer circuit layer 401 are collectively laminated on both surfaces of the core substrate 100 having the embedded electronic device 300 and then the via hole, and the like, is machined in the insulating layer 400, such that the electronic device 300 may be electrically connected to the circuit layer 101 and/or the outer circuit layer 401.

Herein, FIG. 12 is a plan view of the printed circuit board having an embedded electronic device according to the preferred embodiment of the present invention and is a diagram before the electronic device 300 is mounted and after the cavity 200 of the core substrate 100 is formed.

It may confirm the taper structure in which the width 200-a of the cavity of the upper surface is formed to be larger than the width 200-b of the cavity of the lower surface.

According to the printed circuit board having an embedded electronic device and a method of manufacturing the same in accordance with the preferred embodiments of the present invention, the electronic device is supported on the entire surface of the cavity so as to remove the necessity of the use of the tape, thereby reducing costs and simplifying the manufacturing process.

Further, it is possible to reduce the factors of a defect due to the sequential lamination which is required to embed the electronic device and simplify the number of processes.

In addition, it is possible to improve the performance by reducing the factors of the interfacial interlayer delamination defect, which is a problem of the sequential lamination according to the prior art, by the collective lamination.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A printed circuit board having an embedded electronic device, comprising:
    a core substrate having circuit layers formed on both a top surface and a bottom surface thereof;
    a taper-shaped cavity formed on the core substrate; and
    an electronic device embedded in the cavity,
    wherein a width of the cavity is formed to gradually decrease in a direction toward the bottom surface of the core substrate from the top surface of the core substrate, and a width of the cavity of a lower surface at the bottom surface of the core substrate is formed to be smaller than that of a lower portion of the electronic device, and
    wherein an edge of the lower portion of the electronic device is in contact with a tapered surface of the cavity.

2. The printed circuit board as set forth in claim 1, wherein a width of the cavity of an upper at the top surface of the core substrate is formed to be larger than that of an upper portion of the electronic device.

3. The printed circuit board as set forth in claim 1, wherein a thickness of the electronic device is smaller than a thickness of the core substrate, and wherein top and bottom surfaces of the electronic device are embedded to be spaced apart from both the top surface and the bottom surface of the core substrate, respectively.

4. The printed circuit board as set forth in claim 1, further comprising:
    an insulating layer laminated on both a top surface and a bottom surface of the core substrate having the embedded electronic device.

5. The printed circuit board as set forth in claim 4, further comprising:
    an outer circuit layer formed on the insulating layer.

6. The printed circuit board as set forth in claim 1, wherein a thickness of the core substrate is about 0.15 mm, and a thickness of the electronic device is about 0.13 mm.

7. The printed circuit board as set forth in claim 6, wherein an interval of the cavity is 0.05 to 0.1 mm, and the angle ($\theta$) of a tapered surface of the cavity related to the outermost bottom surface of the core substrate is within the range $52.4° < \theta < 71.6°$.

8. A method of manufacturing a printed circuit board having an embedded electronic device, comprising:
    preparing a core substrate having circuit layers formed on both a top surface and a bottom surface thereof;
    forming a taper-shaped cavity on the core substrate; and
    embedding an electronic device in the cavity;
    wherein in the forming of the cavity, a width of the cavity is formed to gradually decrease in a direction toward the bottom surface of the core substrate from the top surface of the core substrate, and a width of a lower surface of the cavity at the bottom surface of the core substrate is formed to be smaller than that of a lower portion of the electronic device, and
    wherein in the embedding of the electronic device, an edge of a lower portion of the electronic device is in contact with a tapered surface of the cavity.

9. The method as set forth in claim 8, wherein in the forming of the cavity, a width of an upper surface of the cavity at the top surface of the core substrate is formed to be larger than that of an upper portion of the electronic device.

10. The method as set forth in claim 8, wherein in the embedding of the electronic device, a thickness of the electronic device is smaller than a thickness of the core substrate, and top and bottom surfaces of the electronic device are spaced apart from both the top surface and the bottom surface of the core substrate.

11. The method as set forth in claim 8, wherein the forming of the cavity is performed by $CO_2$ laser machining.

12. The method as set forth in claim 8, further comprising:
    laminating insulating layers on both the top and bottom surfaces of the upper and lower portions of the core substrate having the embedded electronic device.

13. The method as set forth in claim 12, further comprising:
    forming an outer circuit layer on the insulating layer.

* * * * *